United States Patent [19]
Yasutake

[11] Patent Number: 5,917,360
[45] Date of Patent: Jun. 29, 1999

[54] DIFFERENTIAL CURRENT-SWITCH CIRCUIT, D/A CONVERSION CIRCUIT AND METHOD OF TRANSIENT RESPONSE REDUCTION

[75] Inventor: Nobuyuki Yasutake, Kasugai, Japan

[73] Assignee: Fujitsu Limited, Kawasaki, Japan

[21] Appl. No.: 08/745,209

[22] Filed: Nov. 8, 1996

[30] Foreign Application Priority Data

Dec. 28, 1995 [JP] Japan ................................. 7-343754

[51] Int. Cl.6 .............................. H03K 17/16; H03M 5/04
[52] U.S. Cl. ........................ 327/387; 327/103; 327/108; 327/563; 341/136
[58] Field of Search ..................................... 341/133, 136; 327/65, 66, 77, 78, 79, 103, 362, 384, 387, 563, 483, 575, 108; 330/261

[56] References Cited

U.S. PATENT DOCUMENTS

4,651,033  3/1987  Yasutake et al. ....................... 327/483

*Primary Examiner*—Timothy P. Callahan
*Assistant Examiner*—Terry L. Englund
*Attorney, Agent, or Firm*—Nikaido, Marmelstein Murray & Oram LLP

[57] ABSTRACT

When a pair of emitter-coupled transistor switches 22A and 22B are switched over, the D flipflop 26A shifts the base potential of a transistor buffer circuit 24 to reduce a potential fluctuation at a constant current source 21, reducing a current oscillation caused by the transient response of the constant current source 21 in which feedback control is performed by a comparator 214. In another construction, a potential oscillation waveform of the connected emitter node is stored in a RAM and the waveform read out of the RAM is added to the base of the transistor buffer circuit to reduce the current oscillation.

12 Claims, 10 Drawing Sheets

DIFFERENTIAL CURRENT-SWITCH CIRCUIT, D/A CONVERSION CIRCUIT AND METHOD OF TRANSIENT RESPONSE REDUCTION

BACKGROUND OF THE INVENTION

1. Field of the Invention

The present invention relates to a differential current-switch circuit, a D/A conversion circuit employing this differential current-switch circuit and a method of transient response reduction.

2. Description of the Related Art

Figure 7:
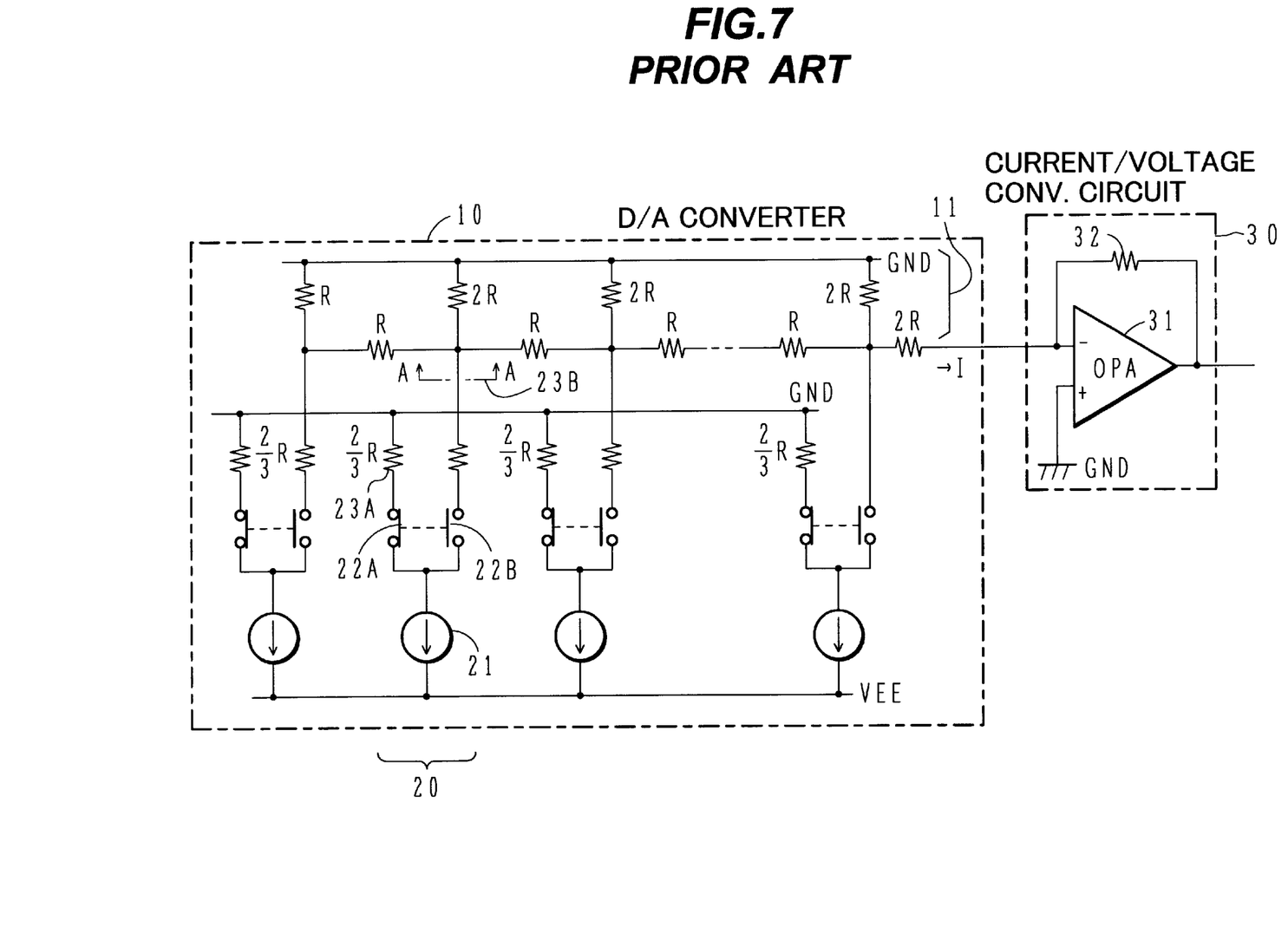
FIG. 7 shows a current drive ladder type D/A converter in the prior art.

In a system for electron beam exposure, since drawing is performed by scanning an electron beam onto a wafer, the exposure time is long. Thus, it is necessary to improve the speed of the electron beam scanning performed by a deflector. To satisfy this requirement, a D/A converter 10, shown in FIG. 7, which is cap able of high speed operation, is employed. This D/A converter 10, which is a current-drive ladder type converter, is provided with a resistance ladder circuit 11 having resistors whose resistance values are R and 2R and differential current-switch circuits 20, structured identically to one another, the number of which is equal to the number of input bits of the D/A converter 10. The current switch circuits 20 are connected between a ground wiring GND at 0 V and a power-supply wiring VEE with a negative potential of, for instance, −8 V. The current switch circuit 20 comprises a constant current source 21, transistor switches 22A and 22B such that when one is on, the other is off, and resistors 23A and 23B respectively connected in series with the transistor switches 22A and 22B. The resistor 23B is one viewing the resistance ladder circuit 11 from line A—A and its resistance value is 2R/3, and this is the same for each of the current switch circuits corresponding to the individual bits. Therefor, the resistance value of the resistor 23A is also set to 2R/3 and this is the same for each of the current switch circuits. This D/A converter 10 outputs a current I, which is expressed as $$I_{out}=I_c(S0 \cdot 2^0 + S1 \cdot 2^1 + S2 \cdot 2^2 + \ldots + S(n-1) \cdot 2^{(n-1)})$$

in response to bits (S0, S1, S2, ..., Sn−1) of an input value.

The current I is converted to a voltage by a current/voltage conversion circuit 30 comprising a operational amplifier 31 and a resistor 32.

Figure 8:
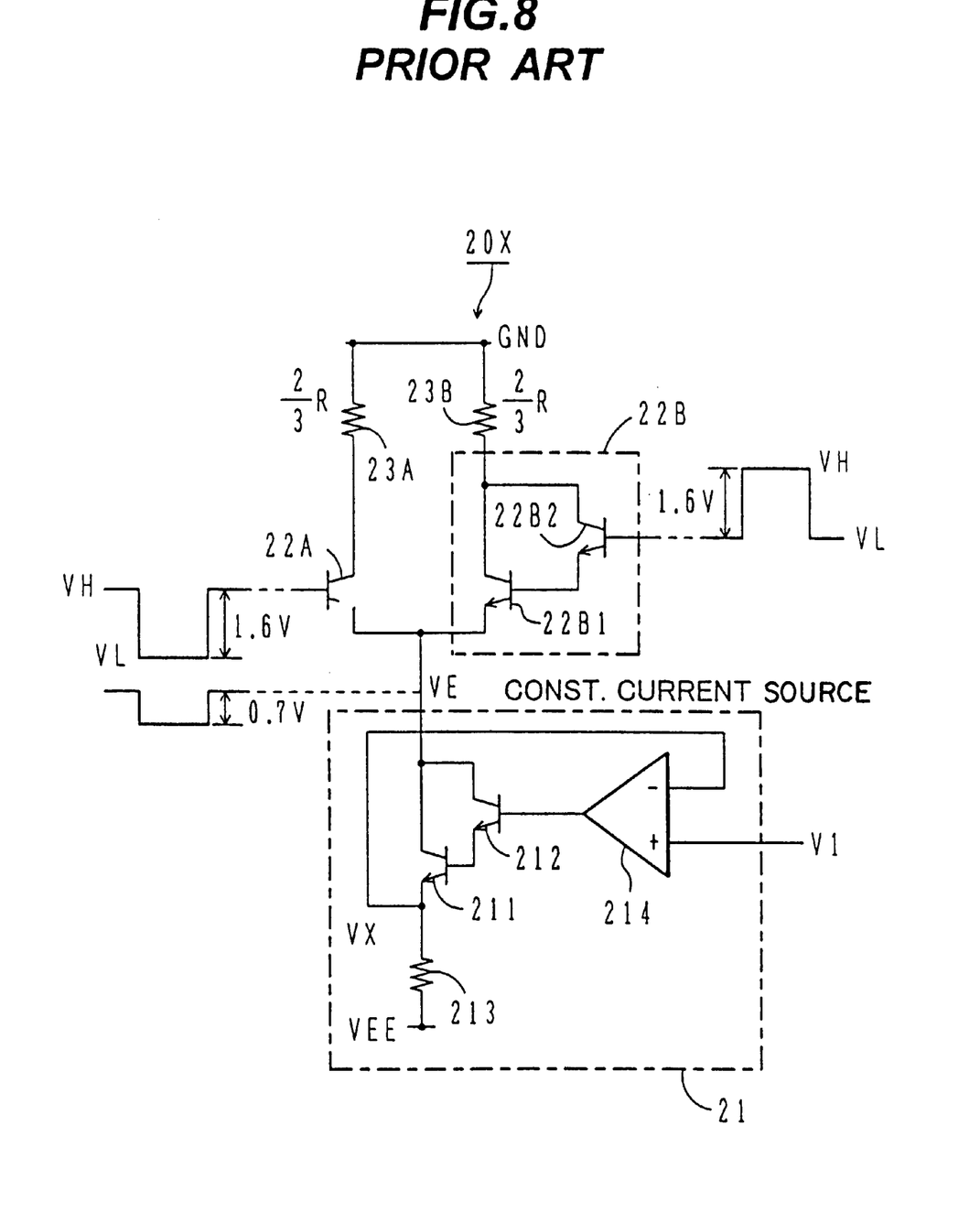
FIG. 8 shows a differential current-switch circuit in the prior art employed in the D/A converter shown in FIG. 7.

A first structural example of the current switch circuit 20 is shown as 20X in FIG. 8. The transistors shown in FIG. 8 are all NPN type transistors.

Since the current flowing through the resistor 23B is used for output of the D/A converter 10, the transistor switch 22B is constituted with a transistor 22B1 and a transistor 22B2 which have the Darlington connection in order to turn it off/on at high speed and with a high degree of accuracy.

The constant current source 21 is provided with transistors 211 and 212 which have the Darlington connection, a resistor 213, which is employed in order to detect the current and convert it to a potential VX, and a comparator 214 for performing feedback control so that the detected potential VX is made equal to a reference potential V1 in order to stabilize the current fluctuation that occurs when the transistor switches 22A and 22B are turned on/off. The Darlington connected transistors 211 and 212 are employed in order to stabilize the current fluctuation at higher speed by a large gain.

A pair of ECL complementary signals are respectively provided to the bases of the transistor switches 22A and 22B2, and the difference between its 'high' state VH and its 'low' state VL may be, for instance, 1.6 V.

When the base of the transistor switch 22A is at 'high' state VH and the base of the transistor switch 22B is at the 'low' state VL, the transistor switch 22A is on and the transistor switch 22B is off, resulting in that a current flowing through the resistor 213 is almost equal to the current (VX−VEE)/R flowing through the resistor 23A. At this time, the emitter potential of the transistor switch 22A is approximately at (VH−0.7)V.

When the base of the transistor switch 22A is at 'low' state VL and the base of the transistor switch 22B is at 'high' state VH, the transistor switch 22A is off and the transistor switch 22B is on, resulting in that the current through the resistor 23B is equal to that described above. At this time, The emitter potential of the transistor 22B1 is at (VH−1.4)V and the potential at the node of connecting the emitters of the transistor switches 22A and 22B1 becomes lower than that in the case described above by 0.7 V.

In the differential current-switch circuit 20X, switching over between the switches may be performed by changing the base potential of only one of the transistor switches 22A and 22B1, leaving the base potential of the other fixed. However, in that case, the fluctuation amplitude of the potential at the node of connecting the emitters is larger than the case described above and, therefore, it is not desirable.

Figure 10:
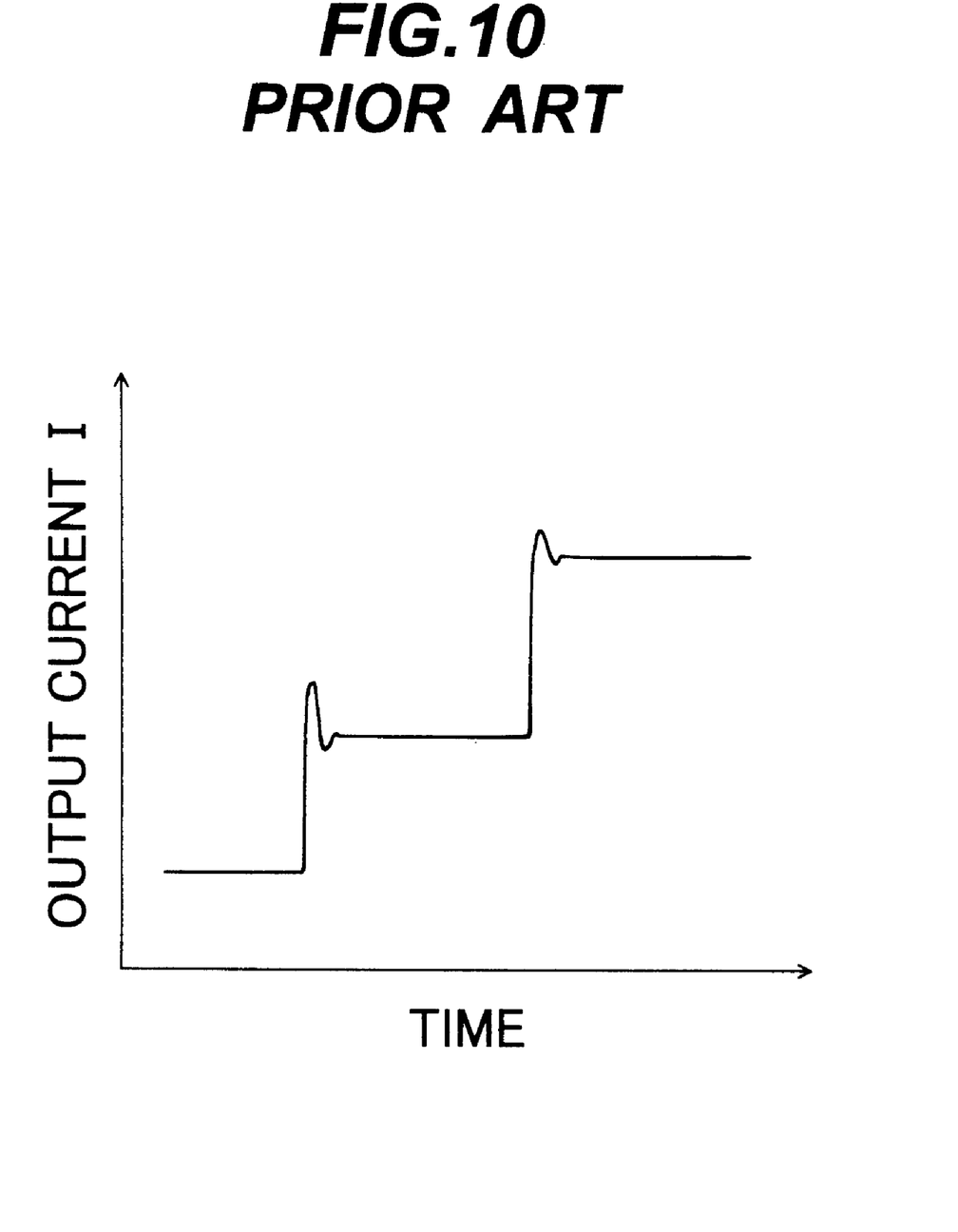
FIG. 10 is a waveform diagram of the outputs from the D/A converter.

As for the DC characteristics, the detected potential VX is made equal to the reference potential V1. However, when the emitter coupled potential VE falls or rises, transient response occurs in the feedback control performed by the comparator 214, causing the detected potential VX to oscillate, which results in oscillation of the current flowing through the resistor 23B. Because of this, as shown in FIG. 10, the output current I from the D/A converter 10 undergoes a transient oscillation at a step change. Since its oscillatory waveform varies depending upon differences in the characteristics of the transistor switches 22A and 22B, it varies, generally speaking, depending upon the input values of the D/A converter 10 before and after the change thereof.

Thus, for the drive circuit for the deflector described above, a method that all the oscillatory waveforms of the output current I corresponding to the input values of the D/A converter 10 are stored in a memory and waveform data are read out from addresses corresponding to an input value of the D/A converter 10 to correct the current I by inverting the sign of the waveform data has been proposed.

Figure 9:
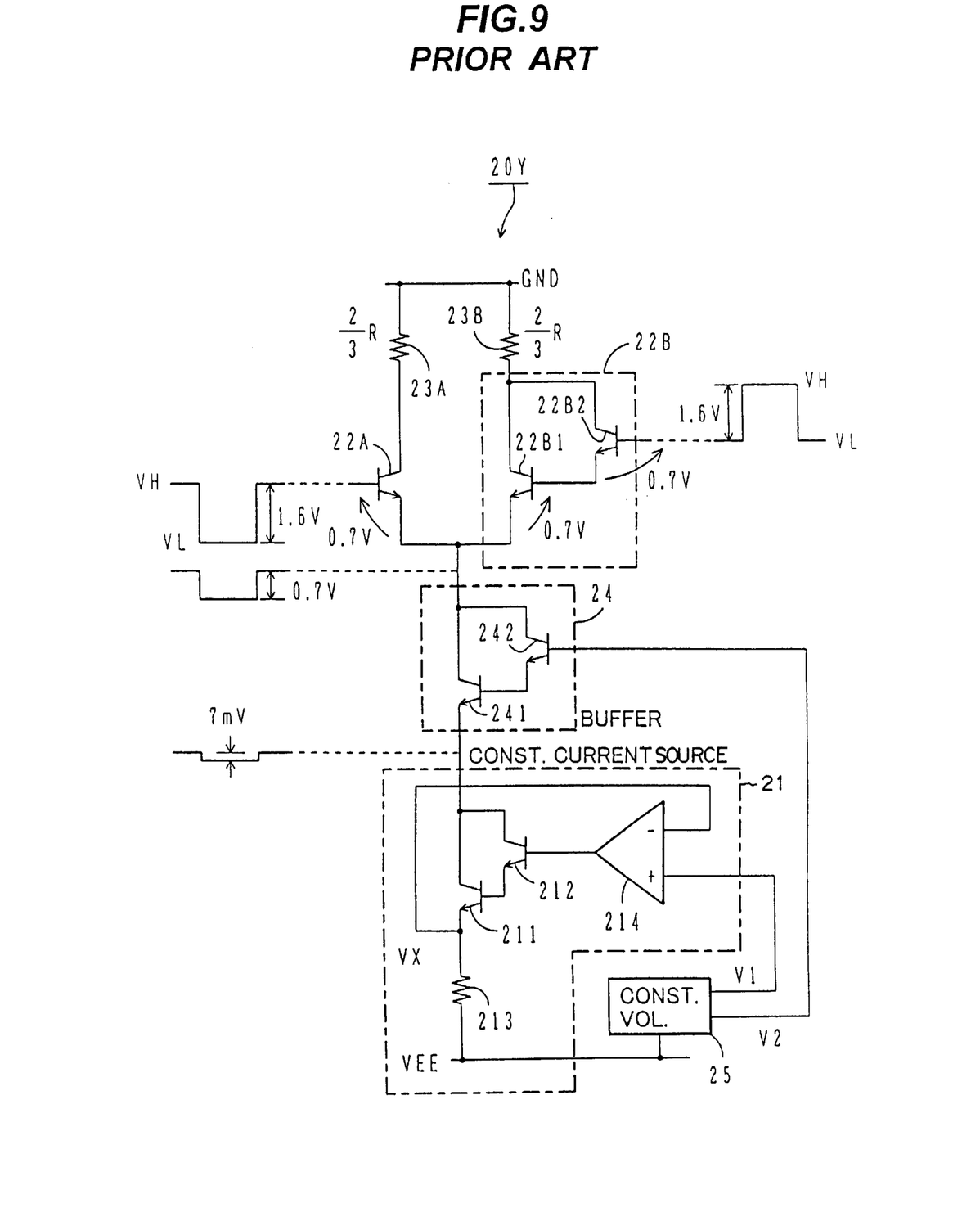
FIG. 9 shows another differential current-switch circuit in the prior art employed in the D/A converter shown in FIG. 7.

In order to reduce the fluctuation of the potential of the connected emitter node that occurs when switching over current paths, a differential current-switch circuit 20Y of FIG. 9 has been employed. In this circuit, a buffer circuit 24 is connected between the connected emitter node and the constant current source 21. In the buffer circuit 24, a transistor 241 and a transistor 242 have the Darlington connection and a potential V2 from a constant voltage source 25 is applied to the base of the transistor 242 so that the buffer circuit 24 can also operate as a constant current source. A measurement result indicates that the fluctuation of the emitter potential of the transistor 241 can be reduced to 7 mV, which is approximately 1/100 of the emitter coupled potential VE.

Since the Darlington connection is employed to achieve fast response at the constant current source 21 and its current amplification factor hoe is comparatively large, transient response is likely even when the fluctuation is slight. Since minute patterns are exposed in an electron beam exposure system, a high accuracy D/A converter 10 with approximately 18 bits is employed and, as a result, even if the fluctuation is at approximately 7 mV as described above, the oscillation cannot be disregarded. In order to further reduce this oscillation, buffer circuits 24 may be connected over two stages. However, this will increase the number of transistor stages between power-supply wirings, which will result in an increase in the power-supply voltage required and also result in an increase in the characteristic change due to heat arising from the increase in power consumption, further presenting a cause of reducing the operating speed.

SUMMARY OF THE INVENTION

Accordingly, an object of the present invention is to provide a differential current-switch circuit, a D/A conversion circuit employing this differential current-switch circuit and a method of transient response reduction, that are capable of reducing the current oscillation when switching over current paths without increasing the number of transistor stages between a pair of power-supply wirings.

According to the 1st aspect of the present invention, there is provided a differential current-switch circuit comprising: a pair of transistor switches connected at one ends thereof to each other, one of the transistor switches being turned on while the other being turned off; a constant current source; and a transistor buffer circuit, for reducing a first fluctuating potential at an end connected to the constant current source against a second fluctuating potential at the one ends, connected between the one ends and the constant current source, the transistor buffer circuit having a control input; the differential current-switch circuit further comprising a correction circuit for shifting up/down a potential at the control input in order to reduce the first fluctuating potential when the one of the transistor switches is turned on/off respectively.

With the 1st aspect according to the present invention, since the fluctuating potential at the end connected to said constant current source is reduced when switching over current paths, an advantage is achieved in that an oscillating current due to a transient response of the constant current source is prevented, enabling a reduction in the current oscillation. In addition, since the number of transistor stages between a pair of the power-supply wirings is not increased, there is an advantage in that it is not necessary to raise the power-supply voltage. This prevents an increase in power consumption and ensuring that the operating speed does not become reduced.

In the 1st mode of the 1st aspect of the present invention, it further comprises a first D flipflop through which the pair of transistor switches are on/off controlled, and the correction circuit has a second D flipflop with an input commonly connected to an input of the first D flipflop, a difference between one output potential and another output potential of two state thereof being equal to a potential shift of the control input.

With the 1st mode, since the second D flipflop is provided independently of the first D flipflop, advantages are achieved in that timing adjustment for correction is facilitated and that the structure is simplified.

In the 2nd mode of the 1st aspect of the present invention, the correction circuit further has an adder circuit for adding an output potential from the second D flipflop and a constant potential.

With the 2nd mode, since there are two parameters for the correction potential, an advantage is achieved in that the correction accuracy is improved.

In the 3rd mode of the 1st aspect of the present invention, it further comprises a delay circuit connected between a clock input of the first D flipflop and a clock input of the second D flipflop.

With the 3rd mode, since the time when the bit for transistor switch control is held to the first D flipflop is delayed, there is enough time for correction to be performed by the correction circuit, facilitating the timing adjustment described above.

According to the 2nd aspect of the present invention, there is provided a differential current-switch circuit comprising: a pair of transistor switches connected at one ends thereof to each other, one of the transistor switches being turned on while the other being turned off; a constant current source; and a transistor buffer circuit, for reducing a first fluctuating potential at an end connected to the constant current source against a second fluctuating potential at the one ends, connected between the one ends and the constant current source, the transistor buffer circuit having a control input; the differential current-switch circuit further comprising a correction circuit having; a memory for storing correction waveform data; a D/A conversion circuit for converting data read out of the memory to an analog potential to provide to the control input or to the end connected to the constant current source via a capacitor; and a read control circuit for reading data out of the memory in synchronization with a clock when the pair of transistor switches is switched over.

With the 2nd aspect according to the present invention, even when the potential at the one ends of the transistor switches oscillates due to differences in the characteristics of the transistor switches when the current paths are switched over, the fluctuating potential at the end connected to said constant current source is reduced. Therefore, an advantage is achieved in that a current oscillation due to the transient response of the constant current source is prevented, resulting in reducing the current oscillation. In addition, since the number of transistor stages between a pair of the power-supply wirings is not increased, an advantage is achieved in that it is not necessary to increase the power-supply voltage, preventing an increase in power consumption and ensuring that the operating speed is not lowered.

In the 1st mode of the 2nd aspect of the present invention, the correction circuit further has an A/D conversion circuit for converting the second fluctuating potential at the one ends to digital values as the correction waveform data to be stored in the memory.

With the 1st mode, since correction waveform data are obtained by the differential current-switch circuit itself, an advantage is achieved in that the handling of the differential current-switch circuit is facilitated.

In the 2nd mode of the 2nd aspect of the present invention, the read control circuit has: a counter to count the clock for making address in the memory with a count; an RS flipflop to be set with a pulse supplied to a clock input of the first D flipflop and to be reset when the count reaches a value; and a logic gate circuit for providing the clock to a clock input of the counter during the RS flipflop being set.

With the 2nd mode, an advantage is achieved in that obtaining the correction waveform data and correcting are performed with good timing.

In the 3rd mode of the 2nd aspect of the present invention, the constant current source has a comparator circuit for performing feedback control to ensure that a detected potential changing in correspondence to a current flowing through the constant current source becomes a reference potential, the differential current-switch circuit further comprises: a second correction circuit for shifting the reference potential in order to reduce fluctuation of the current when the pair of transistor switches is switched over.

With the 3rd mode, even if a constant current source with a relatively large transient response due to feedback control is used, correction is performed sequentially over two stages. Therefore, an advantage is achieved in that the accuracy of correction is improved and the oscillating current is effectively reduced.

In the 4th mode of the 2nd aspect of the present invention, the second correction circuit has a third D flipflop with an input connected to an input of the second D flipflop and an output providing two states having a potential difference equal to a shift of the reference potential.

With the 4th mode, since the third D flipflop is provided independently of the first D flipflop and the second D flipflop, advantages are achieved in that the timing adjustment for correction is facilitated and that the structure is simplified.

According to the 3rd aspect of the present invention, there is provided an D/A conversion circuit for outputting a current I, where $I=I(S0\cdot 2^0+S1\cdot 2^1+S2\cdot 2^3 0 \ldots +Sn-1\cdot 2^{n-1})$, in response to bits (S0, S1, S2, Sn−1) of an input value, the D/A conversion circuit has a differential current-switch circuit for each one of bits, the differential current-switch circuit comprising: a pair of transistor switches connected at one ends thereof to each other, one of the transistor switches being turned on while the other being turned off in correspondence to a value of the one bit; a constant current source; a transistor buffer circuit, for reducing a first fluctuating potential at an end connected to the constant current source against a second fluctuating potential at the one ends, connected between the one ends and the constant current source, and the transistor buffer circuit having a control input; and a correction circuit for shifting up/down a potential at the control input in order to reduce the first fluctuating potential when the one of the transistor switches is turned on/off respectively.

With the 3rd aspect according to the present invention, since the oscillation occurring during a step change in the output current of the D/A conversion circuit is reduced, an advantage is achieved in that, for instance, when employing it in a deflector drive circuit in a system for charged article beam exposure, it becomes possible to draw more minute patterns.

According to the 4th aspect of the present invention, there is provided a method of transient response reduction for a differential current-switch circuit comprising: a pair of transistor switches connected at one ends thereof to each other, one of the transistor switches being turned on while the other being turned off; a constant current source; and a transistor buffer circuit, for reducing a first fluctuating potential at an end connected to the constant current source against a second fluctuating potential at the one ends, connected between the one ends and the constant current source, the transistor buffer circuit having a control input; the method comprising the step of: shifting up/down a potential at the control input in order to reduce the first fluctuating potential when the one of the transistor switches is turned on/off respectively.

DESCRIPTION OF THE PREFERRED EMBODIMENTS

Referring now to the drawings, preferred embodiments of the present invention are described below.

First Embodiment

Figure 1:
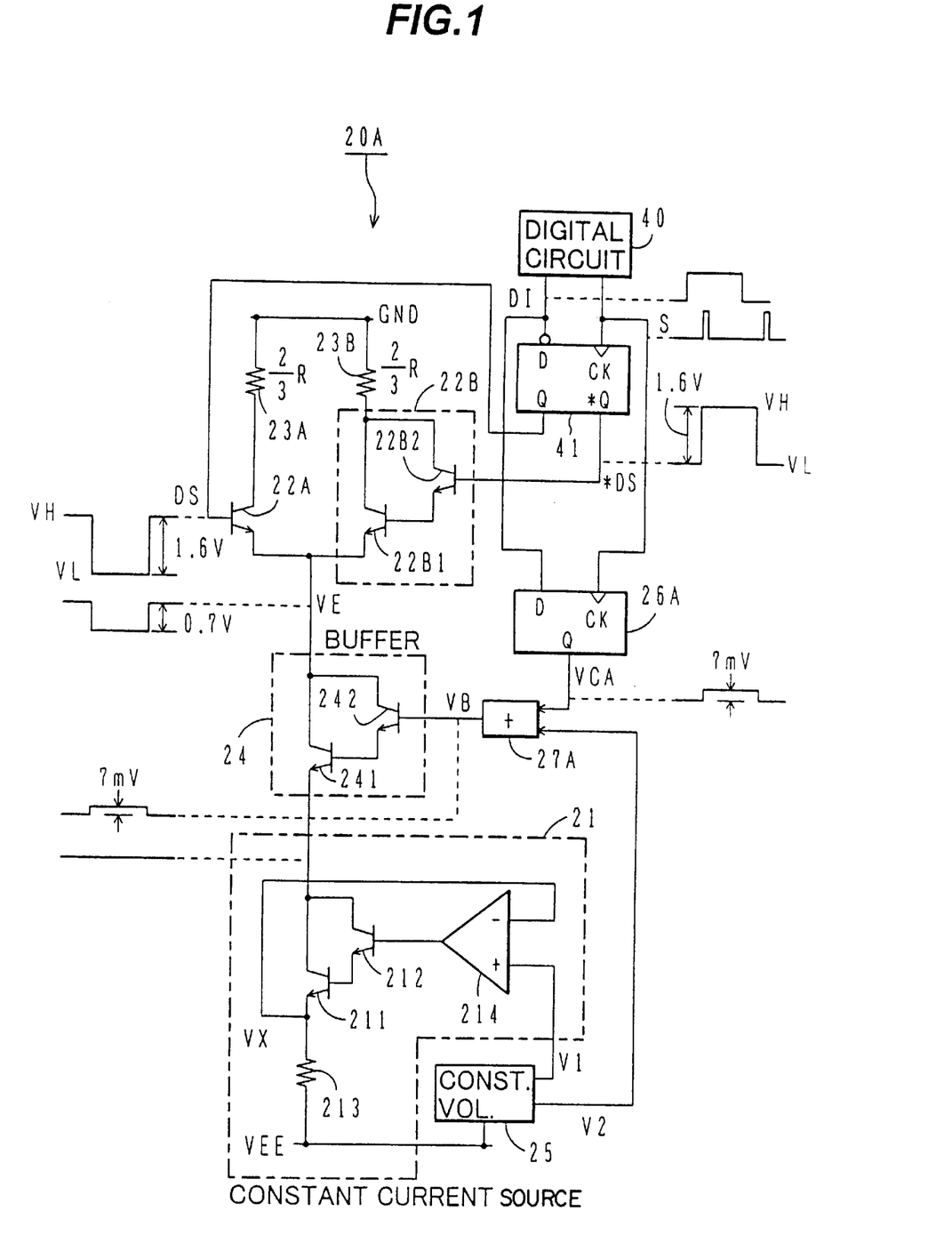
FIG. 1 shows a differential current-switch circuit in a first embodiment according to the present invention.

FIG. 1 shows a current switch circuit 20A in a first embodiment according to the present invention. The same reference characters are assigned to components identical to those shown in FIG. 9 and their explanation is omitted. The transistors shown in FIG. 1 are all NPN-type transistors and they are simply referred to as transistors.

The current switch circuit 20A is obtained by adding a D flipflop 26A and an adder 27A to the current switch circuit 20Y of FIG. 9. A digital circuit 40, which is employed for controlling the current switch circuit 20A, may be, for instance, a CPU. If the current switch circuit 20A is employed in the D/A converter 10 of FIG. 7, the digital circuit 40 will be an external circuit of the D/A converter 10. A D flipflop 41 is employed for conversion timing adjustment for the individual bits of the D/A converter and also for converting a bit DI from the digital circuit 40 to complementary signals DS and *DS.

The bit DI and a strobe signal S from the digital circuit 40 are respectively provided to a data input D and a clock input CK of the D flipflop 41 and the bit DI is held to the D flipflop 41 at the timing of a rise of the strobe signal S. The timing with which the strobe signal S rises is determined by taking into consideration the differences in the signal propagation delays from the individual differential current circuits shown in FIG. 7 to the output of the D/A converter 10. The signals DS and *DS respectively outputted from a non-inverse output Q and an inverse output *Q of the D flipflop 41 are provided to the bases of the transistor switches 22A and 22B2 respectively The bit DI and the strobe signal S are also respectively provided to a data input D and a clock input CK of the D flipflop 26A. The potential amplitude VCA between "1" and "0" outputted from the non-inverse output Q of the D flipflop 26A is set to be equal to the emitter potential fluctuation amplitude of a transistor 241 at the time of switching over between the transistor switches 22A and 22B, e.g. 7 mV. The adder 27A applies a base potential VB obtained by adding the potential VCA and the potential V2 from a constant voltage source 25 to the base of the transistor 242. The difference between the base potential VB and the emitter potential of the transistor 241 is twice the potential difference Vbe between the base and the emitter of a transistor and is a constant value of approximately 1.4 V. Consequently, the fluctuation amplitudes of the potentials VCA and VB and the emitter potential of the transistor 241 are equal to one another.

The signal propagation delays of the D flipflops 41 and 26A and the adder 27A are adjusted to ensure that the signal propagation time from the input of the D flipflop 41 through the D flipflop 41, the transistor switch 22B and the buffer circuit 24 to the emitter of the transistor 241, and the signal propagation time from the input of the D flipflop 41 through the D flipflop 26A, the adder 27A and the buffer circuit 24 to the emitter of the transistor 241 are equal. Since the D flipflop 26A is provided independently of the D flipflop 41, this adjustment can be performed more easily compared to adjustment in a structure in which, instead of employing the D flipflop 26A, the output from the D flipflop 41 is shifted to be supplied to the adder 27A.

Assume that, initially, the bit DI is at 'low' state, the outputs Q and *Q of the D flipflop 41 are at 'high' state VH and 'low' state VL respectively. In that case, the transistor switches 22A and 22B are on and off respectively and a current approximately equal to the current (VX−VEE)/R that flows through a resistor 213, flows through the resistor 23A. The emitter potential of the transistor switch 22A is approximately at (VH−0.7)V.

Next, the bit DI becomes, 'high' state. When the strobe signal S rises, the output Q and *Q of the D flipflop 41 respectively shift to 'low' state VL and 'high' state VH, the transistor switches 22A and 22B are respectively set to off and on and the emitter coupled potential VE is reduced by 0.7 V to (VH−2×0.7)V. This change is reduced to approximately $\frac{1}{100}$ by the buffer circuit 24 and the drop in the emitter potential of the transistor 241 is approximately 7 mV if the base potential VB is constant.

However, since the base potential VB goes up by 0.7 mV in synchronization with this change, the emitter potential of the transistor 241 becomes almost constant. Therefor, at the time when the switching over occurs between the transistor switch 22A and the transistor switch 22B, i.e., at the time when the current paths are switched, the oscillation of the detected potential VX due to the transient response in the feedback control performed by the comparator 214 is reduced, and when the transistor switch 22B is set to on, the oscillation of the current flowing through the resistor 23B is reduced.

Moreover, since there is only one stage of buffer circuit 24 and the number of stages of the transistors between the power-supply wirings GND and VEE is the same as that in the differential current-switch circuit 20Y shown in FIG. 9, it is not necessary to increase the power-supply voltage. This ensures that, an increase in power consumption is prevented and that the operating speed is not reduced. VEE may be, for instance, −8 V.

Second Embodiment

Figure 2:
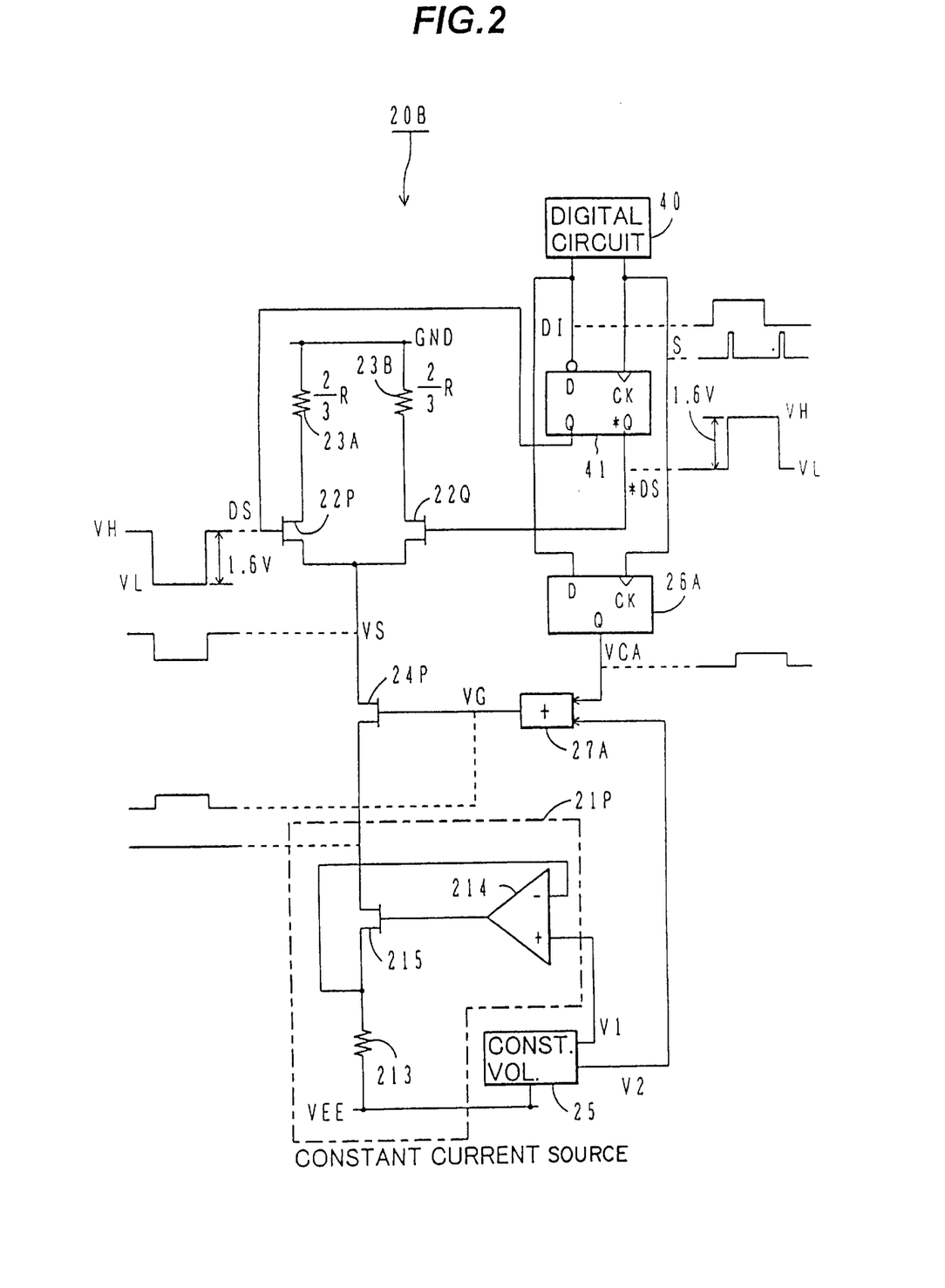
FIG. 2 shows a differential current-switch circuit in a second embodiment according to the present invention.

FIG. 2 shows the current switch circuit 20B in a second embodiment according to the present invention.

In this circuit, in place of the transistor switches 22A and 22B and the buffer circuit 24 in FIG. 1, transistors 22P, 22Q and 24P respectively are employed and in place of the transistors 211 and 212 in FIG. 1, a transistor 215 is used. The transistors 22P, 22Q, 24P and 215 are all FET transistors and may be, for instance, nMOS transistors.

Although the transistor 22P and the transistor 22Q are symmetrical elements in the circuit diagram, the threshold voltages of the transistor 22P and 22Q are normally different from each other due to dispersion of production process. In this case, since the source coupled potential VS at the node of connecting between the sources of the transistors 22P and 22Q is different depending upon whether the transistor 22P or the transistor 22Q is on, the current oscillates when the current path is switched over for the same reason as that described above. This oscillation is reduced by the D flipflop 26A and the adder 27A in the manner similar to that in FIG. 1.

Third Embodiment

Figure 3:
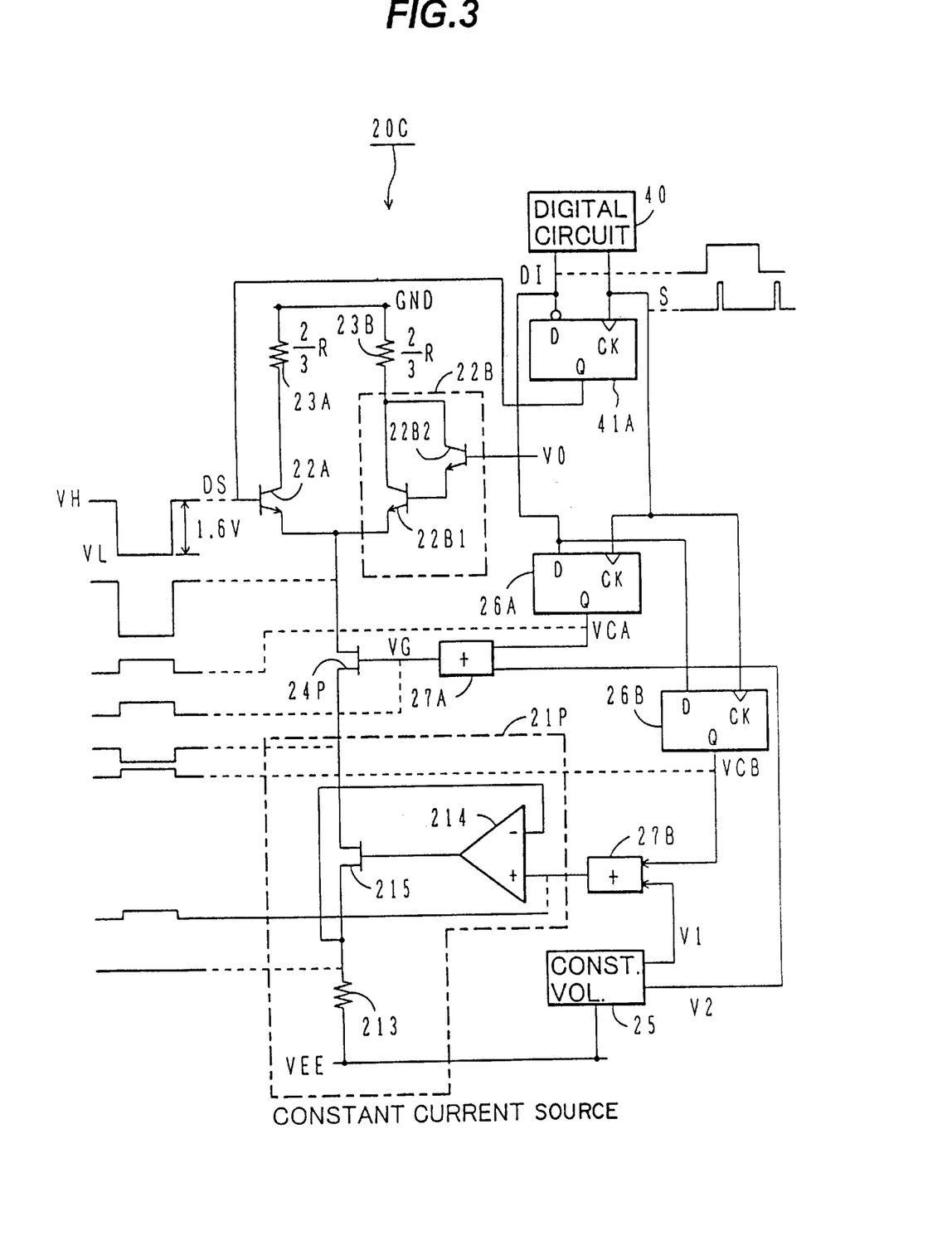
FIG. 3 shows a differential current-switch circuit in a third embodiment according to the present invention.

FIG. 3 shows the current switch circuit 20C in a third embodiment according to the present invention.

In this circuit, the base potential is fixed at V0 and the current path is switched over by setting DS to DS<V0 or DS>V0. Although the fluctuation amplitude of the emitter coupled potential VE is larger than in the case shown in FIG. 1, since the D flipflop 26A and the adder 27A are employed, it can, in principle, be reduced to 0 by selecting an appropriate design parameter for the D flipflop 26A to set the potential VCA at an appropriate value.

Since it is not necessary that a D flipflop 41A has complementary outputs, the structure can be simplified compared to that of the D flipflop 41 shown in FIG. 1.

Since, generally speaking, the dispersion of the threshold voltage of the FET transistor 24P is larger than the dispersion of the voltage between the base and the emitter of a bipolar transistor, the source potential fluctuation of the transistor 24P is primarily reduced by the D flipflop 26A and the adder 27A and the remaining fluctuation is secondarily eliminated by a D flipflop 26B and an adder 27B.

The same signal as that provided to the D flipflop 26A is provided to the D flipflop 26B, the potential VCB outputted from the non-inverse output Q of the D flipflop 26B and the reference potential V1 from the constant voltage source 25 are added to each other at the adder 27B with the resulting sum being provided as a reference potential to the non-inverse input of the comparator 214. The comparator 214 is structured identically to the operational amplifier and its DC characteristics ensure that the potentials of the inverse input and the non-inverse input are almost equal to each other.

When the drain potential of the transistor 215 becomes lowered, the source potential of the transistor 215 also becomes lowered if the reference potential remains constant. However, since the reference potential increases, the decrement of the source potential of the transistor 215 is reduced.

Fourth Embodiment

Figure 4:
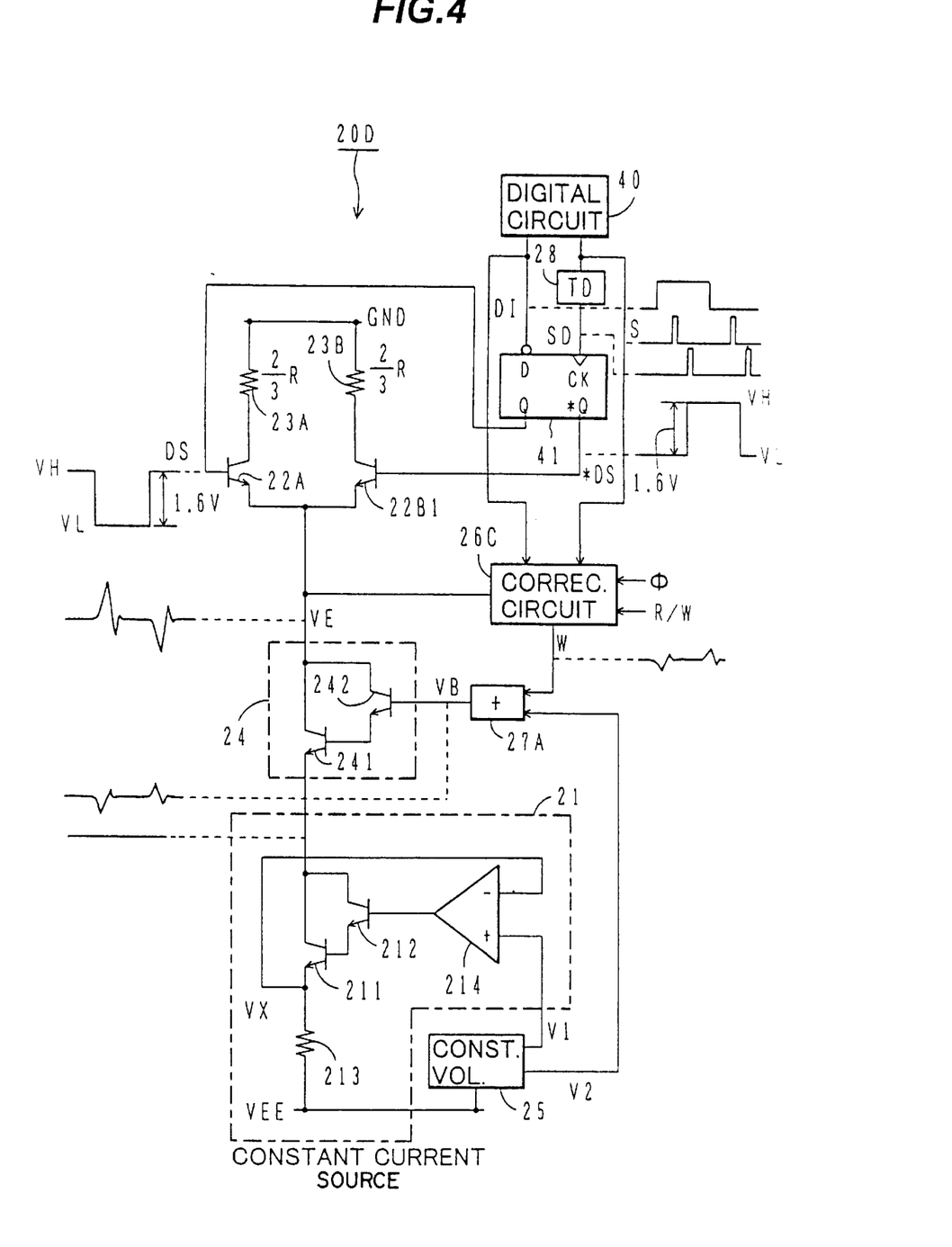
FIG. 4 shows a differential current-switch circuit in a fourth embodiment according to the present invention.

FIG. 4 shows the current switch circuit 20D in a fourth embodiment according to the present invention. In this circuit, the transistor switches 22A and 22B1 are structured symmetrically to each other and in an ideal situation, the emitter coupled potential VE does not fluctuate. But the potential VE does oscillate, when the current paths are switched over, due to differences in the characteristics of the transistor switches 22A and 22B1. Because of this oscillation, an oscillation due to the feedback control performed by the comparator 214 is added.

The basic concept for reducing this oscillation is identical to that employed in FIG. 1. However, since the oscillatory waveform is different depending upon the characteristics of the transistor switches 22A and 22B1, it is necessary to correct the waveform corresponding to each current switch circuit 20D.

Figure 5:
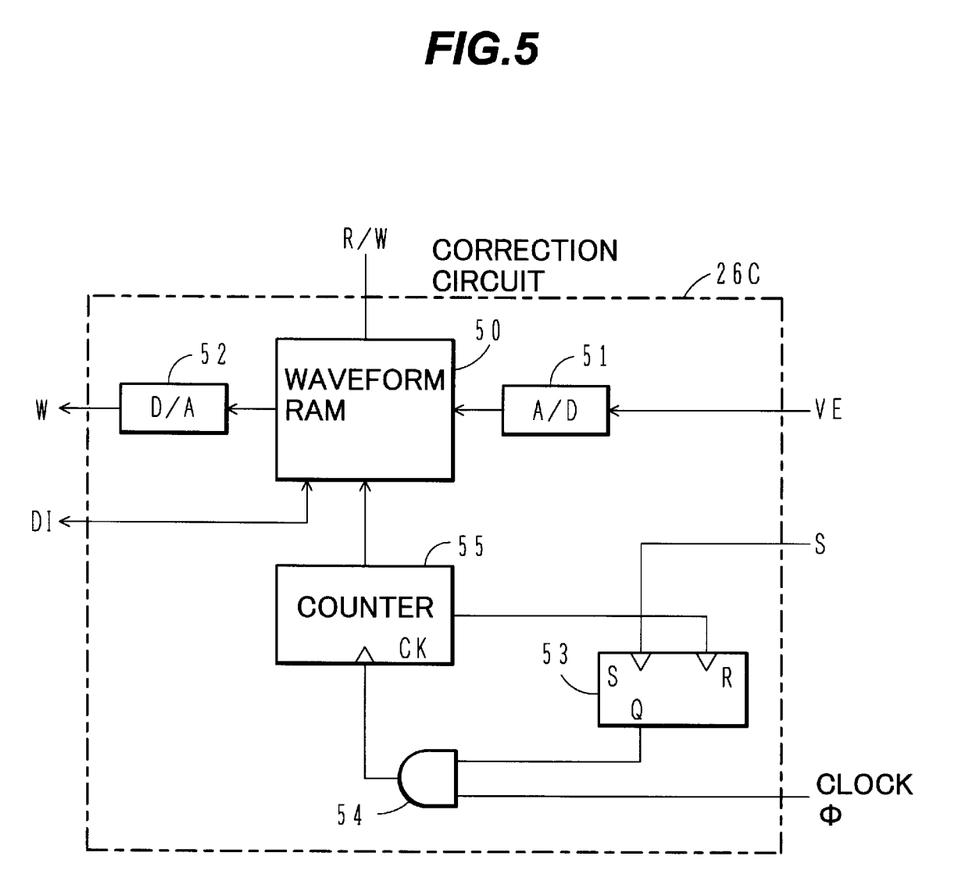
FIG. 5 is a block diagram of a structural example of the correction circuit 26C in FIG. 4.

In order to deal with this, a correction circuit 26C is provided with a waveform RAM 50 as shown in FIG. 5. To summarize, when the correction waveform is stored in the waveform memory 50, a read/write signal R/W is set to low to make the waveform RAM 50 in the write state and the emitter coupled potential VE is digitized by an A/D converter 51 and stored in the waveform RAM 50. When performing correction, the data in the waveform RAM 50 are read out sequentially and converted to analog as a potential W by a D/A converter 52. This potential W and the potential V2 are added at the adder 27A and the result is applied to the base of the transistor 242 as a base potential VB.

The addresses for write and read at the waveform RAM 50 are generated by an RS flipflop 53, an AND gate 54, a counter 55 and the bit DI. Namely, the RS flipflop 53 is set at a rise timing of the strobe signal S and the AND gate 54 is opened by the RS flip-flop 53 with 'high' state of the non-inverse output Q so that a clock$\phi$ is counted on the counter 55 and address specification is made for the waveform RAM 50 with the count A and a bit DI as the highest order bit. The reason that the bit DI is used as the highest order bit is that the oscillatory waveform of the emitter coupled potential VE at a rise of the signal DS in FIG. 4 is different from that at a fall of the signal DS.

When a carry is output from the highest order bit of the counter 55, the count A is reset to 0 and the RS flipflop 53 is reset to close the AND gate 54. The product of the cycle of the clock$\phi$ and the maximum value of the count A is set to be below the cycle of the sampling by the strobe signal S.

The ratio between the emitter coupled potential VE and the corresponding potential W is determined by the gains of the A/D converter 51 and the D/A converter 52 and, e.g. the gain of the D/A converter 52 is adjustable and negative quantity.

Although it is necessary to provide a correction circuit 26C for each of the differential current-switch circuits in the D/A converter 10 in FIG. 7, since the number of waveforms to be stored in memory is greatly reduced compared to the case in the prior art in which all the transient waveforms corresponding to the previous and current input values of the D/A converter are stored to perform correction on outputs thereof, the memory capacity required is greatly reduced, simplifying the structure and also reducing the length of time required for storing the waveforms.

Although the D/A converter 52 is required for each of the differential current-switch circuits in the D/A converter 10 of FIG. 7, since the A/D converter 51 is used during a preparatory period, only one A/D converter 51 may be provided for all the bits. In that case, the destinations of the output from the A/D converter 51 are switched over by a demultiplexer and an oscillating waveform for each bit of the D/A converter 10 is stored in the waveform RAM 50.

Since the signal propagation delay time from the rise of the signal S until the potential W is initially output from the correction circuit 26C is relatively long, the strobe signal S is provided to a delay circuit 28 to be delayed before being provided as a strobe signal SD to the clock input CK of the D flipflop 41 on the one hand, and the strobe signal S is provided directly to the correction circuit 26C on the other.

Thus, since the time when the bit DI is held to the D flipflop 41 is delayed, it becomes possible to perform adjustment to ensure that the signal propagation delay time in the above-described two paths extending to the emitter of the transistor 241 are equal.

If a delay circuit is connected to the output of the D flipflop 41, delay circuits are required for the non-inverse output Q and the inverse output *Q and, consequently, it becomes necessary to adjust the difference in the delays thereof. In contrast, in the structure described above, this adjustment becomes unnecessary and also the structure is simplified.

Fifth Embodiment

Figure 6:
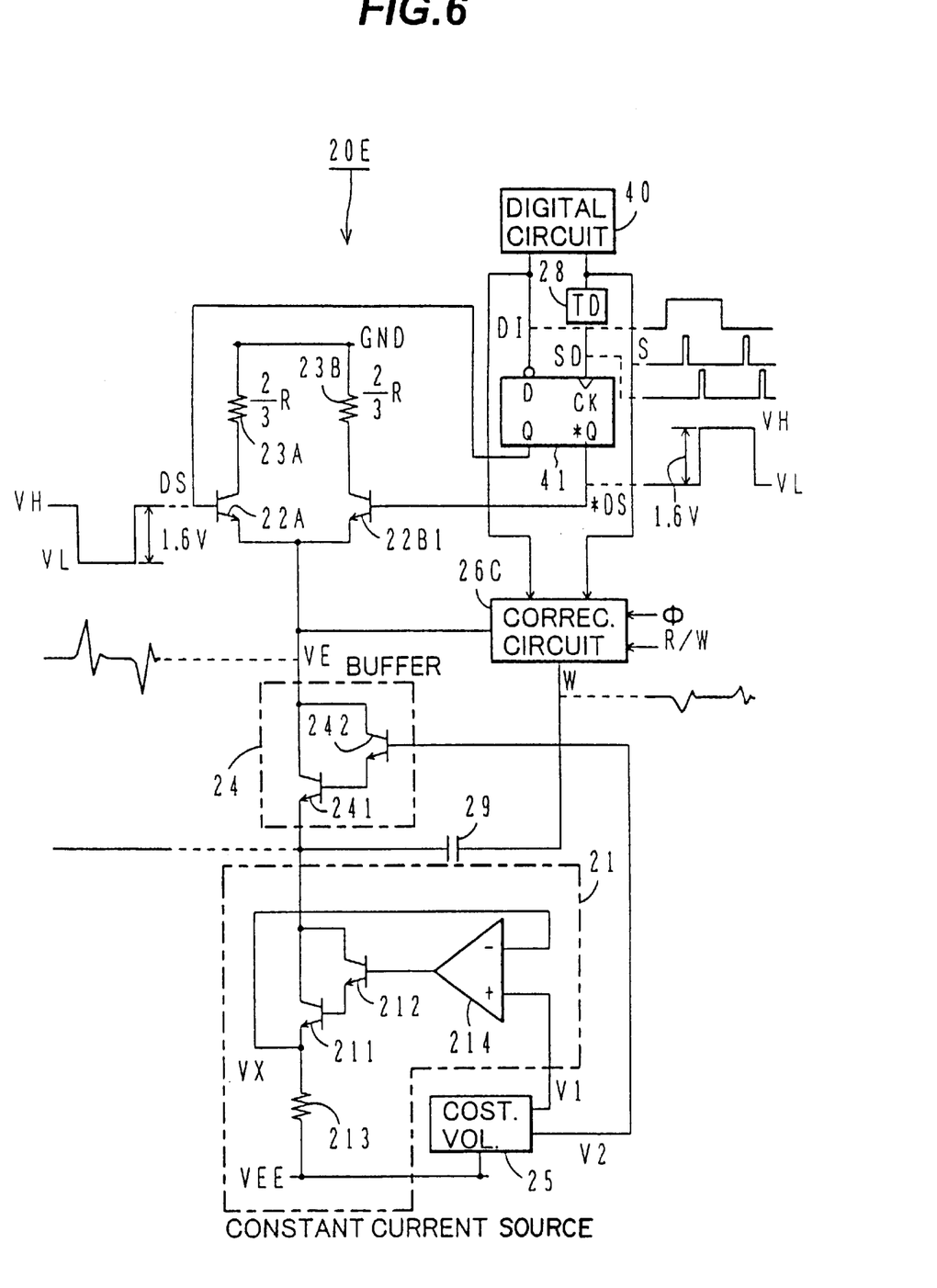
FIG. 6 shows a differential current-switch circuit in a fifth embodiment according to the present invention.

FIG. 6 shows the current switch circuit 20E in a fifth embodiment according to the present invention.

In this circuit, in place of the adder 27A shown in FIG. 4, an output of a correction circuit 26C are AC coupled through a capacitor 29 to the emitter of the transistor 241 to apply the potential W. Other aspects are identical to those shown in FIG. 4.

In the fifth embodiment, since the adder 27A shown in FIG. 4 can be omitted, the structure is simplified compared to the fourth embodiment.

By applying any one of the differential current-switch circuits described above in the D/A converter 10 of FIG. 7, oscillation during a step change of its output current is reduced and when this D/A converter is employed in a deflector drive circuit in a charged particle beam exposure system, it becomes possible to draw more minute patterns.

Although preferred embodiments of the present invention have been described, it is to be understood that the invention is not limited thereto and that various changes and modifications may be made without departing from the spirit and scope of the invention.

For example, although the explanation has been given so far in regard to a case in which the current source is connected to a power-supply wiring of the low potential side, in reference to the differential current-switch circuit in each embodiment above, a structure in which NPN transistors are replaced by PNP transistors with VEE>GND and the direction of the current being reversed, as is done normally, may be adopted.

If the potential V2 is made to be included as a bias in the output potential VCA of the D flipflop 26A, the adder 27A will not be required. This point also applies to the D flipflop 26B.

In addition, instead of fixing the base potential of the transistor 22B2 in FIG. 3, the base potential of the transistor 22A may be fixed.

The constant current source may be a structure in which a pair of current mirror circuits are employed with feedback control performed on one of them by the comparator 214.

Furthermore, it may be effective to apply the differential current-switch circuit according to the present invention to a current-drive D/A converter which is structured differently from that shown in FIG. 7, an A/D converter provided with the D/A converter and a high speed analog circuit other than a D/A converter.

What is claimed is:

1. A differential current-switch circuit comprising:
   a pair of transistor switches each connected at one end thereof to each other, one of said transistor switches is turned on while the other is turned off;
   a constant current source;
   a transistor buffer circuit, for reducing a first fluctuating potential at an end connected to said constant current source against a second fluctuating potential at said one end, connected between said one end and said constant current source, said transistor buffer circuit having a control input; and
   a correction circuit for shifting up and down a potential at said control input, with current flowing between said one end and said constant current source through transistor buffer circuit, in order to reduce said fluctuating potential when said one of said transistor switches is turned on and off respectively.

2. A differential current-switch circuit according to claim 1, further comprising a first D flipflop through which said pair of transistors are on and off controlled, and
   wherein said correction circuit has a second D flipflop with an input commonly connected to an input of said first D flipflop, a difference between an output potential at one state and an output potential at another state thereof being equal to said potential shift of said control input.

3. A differential current-switch circuit according to claim 2,
   wherein said correction circuit further has an adder circuit for adding said output potential, at one or another state, from said second D flipflop and a constant potential.

4. A differential current-switch circuit according to claim 3, further comprising a delay circuit connected between a clock input of said first D flipflop and a clock input of said second D flipflop.

5. A differential current-switch circuit according to claim 2, wherein said constant current source has a comparator circuit for performing feedback control to ensure that a detected potential changing in correspondence to a current flowing through said constant current source becomes a reference potential, said differential current-switch circuit further comprises:
   a second correction circuit for shifting said reference potential in order to reduce fluctuation of said current when said pair of transistor switches is switched over.

6. A differential current-switch circuit according to claim 5, wherein said second correction circuit has a third D flipflop with an input connected to said input of said second D flipflop and an output providing two states having a potential difference equal to a shift of said reference potential.

7. A differential current-switch comprising:
   a pair of transistor switches each connected at one end thereof to each other, one of said transistor switches is turned on while the other is turned off;
   a constant current source;
   a transistor buffer circuit, for reducing a first fluctuating potential at an end connected to said constant current source against a second fluctuating potential at said one end, connected between said one end and said constant current source, said transistor buffer circuit having a control input; and
   a correction circuit, said correction circuit including
   a memory for storing correction waveform data;
   a read control circuit for reading data out of said memory in synchronization with a clock when said pair of transistor switches is switched over; and
   a D/A conversion circuit for converting said data read out of said memory to an analog potential provided to said end connected to said constant current source via a capacitor or to said control input.

8. A differential current switch circuit according to claim 7,
   wherein said correction circuit further has an A/D conversion circuit for converting said second fluctuating potential at said one end to digital values as said correction waveform data to be stored in said memory.

9. A differential current-switch circuit according to claim 8 wherein said read control circuit has:
   a counter to count said clock for making address in said memory with a count;
   an RS flipflop to be set with a pulse supplied to a clock input of said RS flipflop and to be reset when said count reaches a value; and
   a logic gate circuit for providing said clock to a clock input of said counter during said RS flipflop being set.

10. A D/A conversion circuit for outputting a current $I_{out}$, where $$I_{out} = I_c(S0 \cdot 2^0 + S1 \cdot 2^1 + S2 \cdot 2^2 + \ldots + S(n-1) \cdot 2^{(n-1)}),$$

in response to a constant input current $I_c$ and a number n of input bits (S0, S1, S2 ... S(n−1)) of an input value, said D/A conversion circuit has a differential current-switch circuit for each respective bit of said bits, each said differential current-switch circuit comprising:
   a pair of transistor switches each connected at one end thereof to each other, one of said transistor switches is turned on while the other is turned off in correspondence to a value of said respective bit;
   a constant current source;
   a transistor buffer circuit, for reducing a first fluctuating potential at an end connected to said constant current source against a second fluctuating potential at said one end, connected between said one end and said constant current source, said transistor buffer circuit having a control input; and
   a correction circuit for shifting up and down a potential at said control input, with current flowing between said one end and said constant current source through said transistor buffer circuit, in order to reduce said first fluctuating potential when said one of said transistor switches in turned on and off respectively.

11. A method of transient response reduction for a differential current-switch circuit comprising:
   a pair of transistor switches each connected at one end thereof to each other, one of said transistor switches is turned on while the other is turned off;
   a constant current source; and
   a transistor buffer circuit, for reducing a first fluctuating potential at an end connected to said constant current source against a second fluctuating potential at said one end, connected between said one end and said constant current source, said transistor buffer circuit having a control input;
   said method comprising the step of:
      shifting up and down a potential at said control input, with current flowing between said one end and said constant current source through said transistor buffer circuit in order to reduce said first fluctuating potential when said one of said transistor switches is turned on and off respectively.

12. A method of transient response reduction for a differential current-switch circuit comprising:
   a pair of transistor switches each connected at one end thereof to each other, one of said transistor switches is turned on while the other is turned off;
   a constant current source;
   a transistor buffer circuit, for reducing a first fluctuating potential at an end connected to said constant current source against a second fluctuating potential at said one end, connected between said one end and said constant current source, said transistor buffer circuit having a control input;
   a memory for storing correction waveform data;
   a D/A conversion circuit for converting said correction waveform data read out of said memory to an analog potential provided to said end connected to said constant current source via a capacitor or to said control input; and a read control circuit for reading said correction waveform data out of said memory in synchronization with a clock when said pair of transistor switches is switched over;

said method comprising the steps of:

reading said correction waveform data out of said memory with said read control circuit in synchronization with said clock when said pair of transistor switches is switched over;

converting said correction waveform data to an analog potential with said D/A conversion circuit; and providing said analog potential to said control input or to said end connected to said constant current source.

* * * * *